United States Patent
Yoshikawa et al.

(12) 
(10) Patent No.: US 6,442,049 B1
(45) Date of Patent: Aug. 27, 2002

(54) POWER CONVERSION DEVICE WITH POWER SOURCE VOLTAGE DROP DETECTION UNIT

(75) Inventors: Tadamitsu Yoshikawa, Tokyo; Hiroaki Matsumoto, Saitama-ken, both of (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/059,322

(22) Filed: Jan. 31, 2002

(30) Foreign Application Priority Data

Feb. 2, 2001 (JP) ........................................ 2001-026889

(51) Int. Cl.⁷ ........................... H02M 5/40; H02H 7/125
(52) U.S. Cl. .............................. 363/34; 363/54; 363/57
(58) Field of Search .............................. 363/34, 37, 50, 363/52, 54, 56.01, 57

(56) References Cited

U.S. PATENT DOCUMENTS 5,373,195 A * 12/1994 De Doncker et al. ......... 307/45
5,404,092 A * 4/1995 Gegner ........................ 323/207
5,594,630 A * 1/1997 Baker .......................... 307/105
5,594,635 A * 1/1997 Gegner ........................ 363/124
5,710,699 A * 1/1998 King et al. .................. 318/139

* cited by examiner

*Primary Examiner*—Bao Q. Vu
(74) *Attorney, Agent, or Firm*—Foley & Lardner

(57) ABSTRACT

In a power conversion device according to the present invention, an AC power source voltage signal Vac which is the instantaneous value of AC power source 1 detected by a power source voltage detection circuit comprising a transformer 5, rectifier 6 and A/D converter 7 is averaged by an averaging circuit 9 and an average AC power source voltage signal Vave is output. This average AC power source voltage signal Vave and AC power source voltage signal Vac are compared in comparator 8 and, if their deviation is more than a prescribed value, a power source voltage drop detection signal PSF_S is output. Spurious detection of power source voltage drop resulting from the effect of power source fluctuations can thereby be prevented.

8 Claims, 7 Drawing Sheets

POWER CONVERSION DEVICE WITH POWER SOURCE VOLTAGE DROP DETECTION UNIT

CROSS-REFERENCE TO RELATED APPLICATION

This application claims benefit of priority to Japanese Application No. JP 2001-26889 filed Feb. 2, 2001, the entire content of which is incorporated by reference herein.

BACKGROUND OF THE INVENTION

1. Field of the Invention

The present invention relates to a power conversion device and more particularly relates to a power conversion device wherein control is arranged to be maintained in stable fashion by detecting occurrence of power source voltage drop with high sensitivity without any possibility of spurious detection.

2. Description of the Related Art

FIG. 1 illustrates the construction of a thyristor Leonardo device provided with a power source drop detection circuit.

In FIG. 1, a thyristor converter 2 constituted of a converter for converting AC power from AC power source 1 to any desired DC voltage and an inverter for regenerating the generated power from DC electric motor 3 constituting the load to AC power source 1 is connected to AC power source 1.

When a thyristor converter 2 is performing regenerative operation, if voltage drop or shutdown etc. of AC power source 1 occurs, there is a possibility of loss of commutation, leading to a short-circuit fault; a power source voltage drop detection circuit 4 is therefore provided in order to perform a prescribed protective action on detecting a drop in the voltage of AC power source 1.

Power source voltage drop detection circuit 4 outputs a power source voltage drop detection signal PSF_S (Power Source Fall Signal) by inputting to comparator 8 from the system of AC power source 1 an AC power source voltage signal Vac detected by a power source voltage signal detection circuit comprising transformer 5, rectifier 6 and AC/DC converter 7, and a power source voltage detection signal Vpsf (this signal means setting value).

When power source voltage drop detection signal PSF_S is activated, the thyristor Leonardo device performs a prescribed protective action.

However, in a conventional power source voltage drop detection circuit 4 as described above, there are the following problems.

The system of AC power source 1 fluctuates, influenced by the season and the operating condition of large capacity loads connected to the same system.

Fluctuations of this AC power source 1 have the following effects on power source voltage drop detection circuit 4.

For example, if the voltage of the system of AC power source 1 drops due to increase in the load of a large capacity load in the same system, the difference between power source voltage detection signal Vpsf and AC power source voltage signal Vac diminishes, with the result that the margin in respect of power source voltage detection is eliminated; if the setting of power source voltage detection signal Vpsf is raised in order to raise the detection sensitivity, there is a possibility of spurious detection.

For example, the power source voltage drop detection signal PSF_S when the detection level is taken as 85% is indicated by A in FIG. 2; however, as shown in this Figure, although occurrence of shutdown can be detected, if the voltage of the system of AC power source 1 drops by 15% or more due to power source fluctuation this results in spurious detection even if no shutdown occurs.

Also, if the voltage of the system of AC power source 1 rises due to decrease in the load of a large capacity load, the AC power source voltage signal Vac also rises, so detection of drop of the power source voltage at the original detection level becomes impossible.

SUMMARY OF THE INVENTION

Accordingly, one object of the present invention is to provide a novel power conversion device comprising excellent means capable of detecting power source voltage drop even if the power source is affected by seasonal fluctuation and/or the operating condition of a large capacity load connected to the same system, without being affected thereby.

This object is achieved by a power conversion device having the following construction.

Specifically, a power conversion device according to the present invention that converts power from a power source to any desired voltage, comprises:

averaging means (unit) for obtaining an average power source voltage signal by averaging the power source voltage signal; and power source voltage drop detection means (unit) that compares the average power source voltage signal obtained by this averaging means (unit) and the instantaneous value of the power source voltage signal and outputs a power source voltage drop detection signal on detection of drop of the power source voltage by this deviation becoming more than a fixed value.

With the present invention, spurious detection of power source voltage drop produced by the effects of power source fluctuation such as seasonal fluctuation can be prevented.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
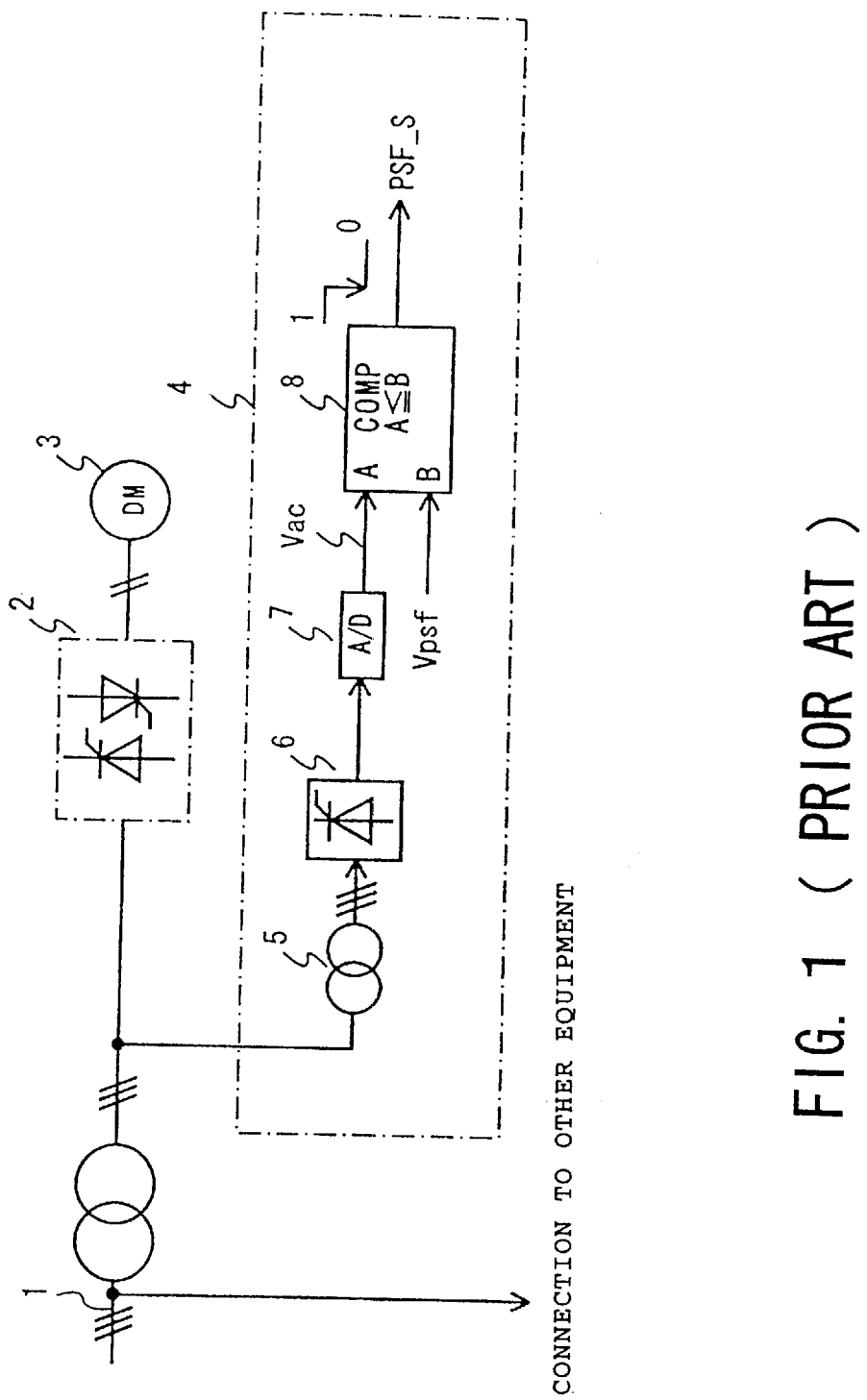
FIG. 1 is a block diagram illustrating the construction of a prior art example.

Referring now to the drawings, wherein like reference numerals designate identical or corresponding parts throughout the several views, and more particularly to FIG. 3 thereof, one embodiment of the present invention will be described.

In the following Figures, including the Figures illustrating the prior art, the same reference symbols indicate the same parts or corresponding parts.

(First Embodiment)

A power conversion device according to a first embodiment of the present invention is described with reference to FIG. 3.

Figure 3:
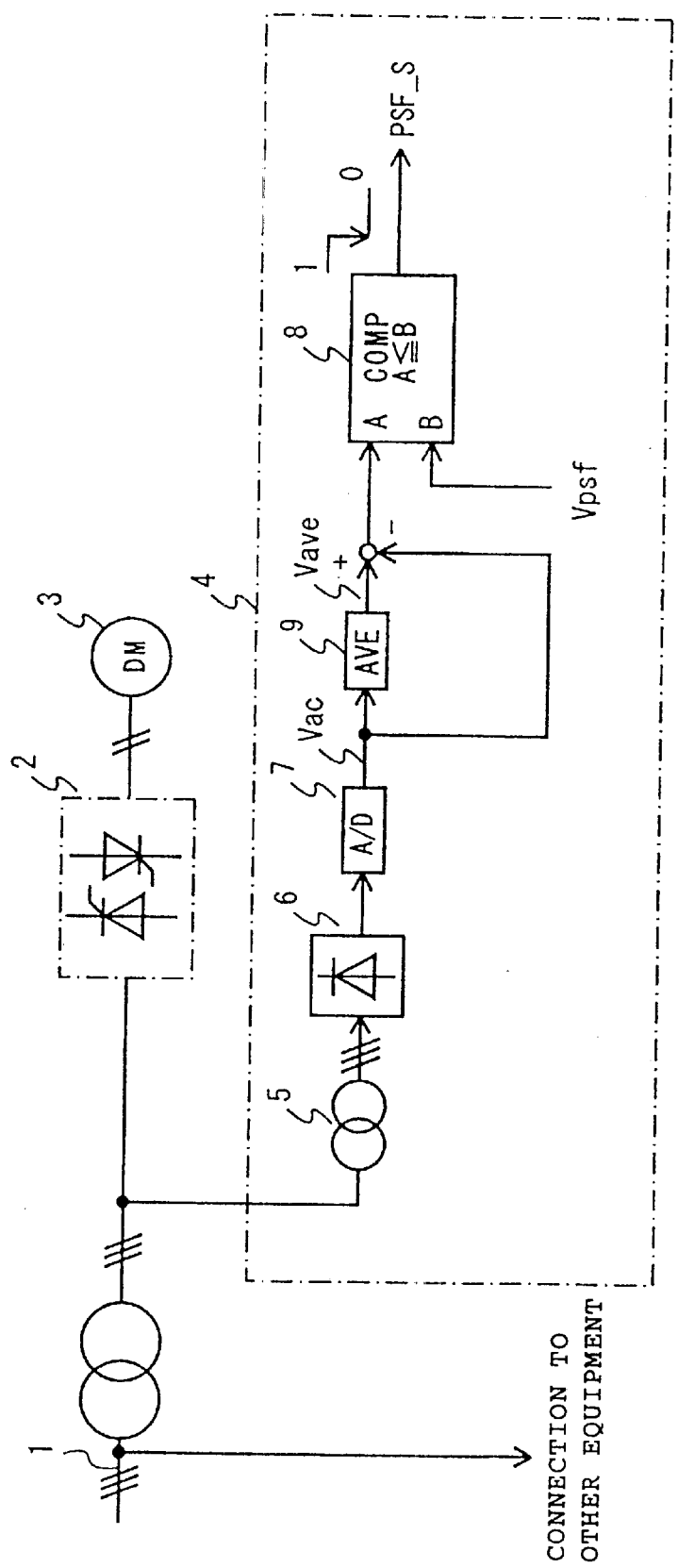
FIG. 3 is a block diagram illustrating the construction of a power conversion device according to a first embodiment of the present invention.

In FIG. 3, an AC power source of voltage signal Vac constituting the instantaneous value of AC power source 1 detected by a power source voltage detection circuit comprising transformer 5, rectifier 6 and A/D converter 7 is input to an averaging circuit 9 and an average AC power source voltage signal Vave is output from averaging circuit 9.

Power source voltage drop detection signal PSF_S is input by comparing this average AC power source voltage signal Vave and the AC power source voltage signal Vac which is the instantaneous value of AC power source 1 and inputting the deviation of these and power source voltage detection signal Vpsf to comparator 8.

For example, if the detection level is taken as being 85% of the average AC power source voltage signal Vave, if the deviation of average AC power source voltage signal Vave and AC power source voltage signal Vac is more than 15% of the mean AC power source voltage signal Vave, power source voltage drop detection signal PSF_S is output (the output signal of comparator 8 changes from "1" to "0") and a drop in the AC power source voltage can thereby be detected.

Figure 2:
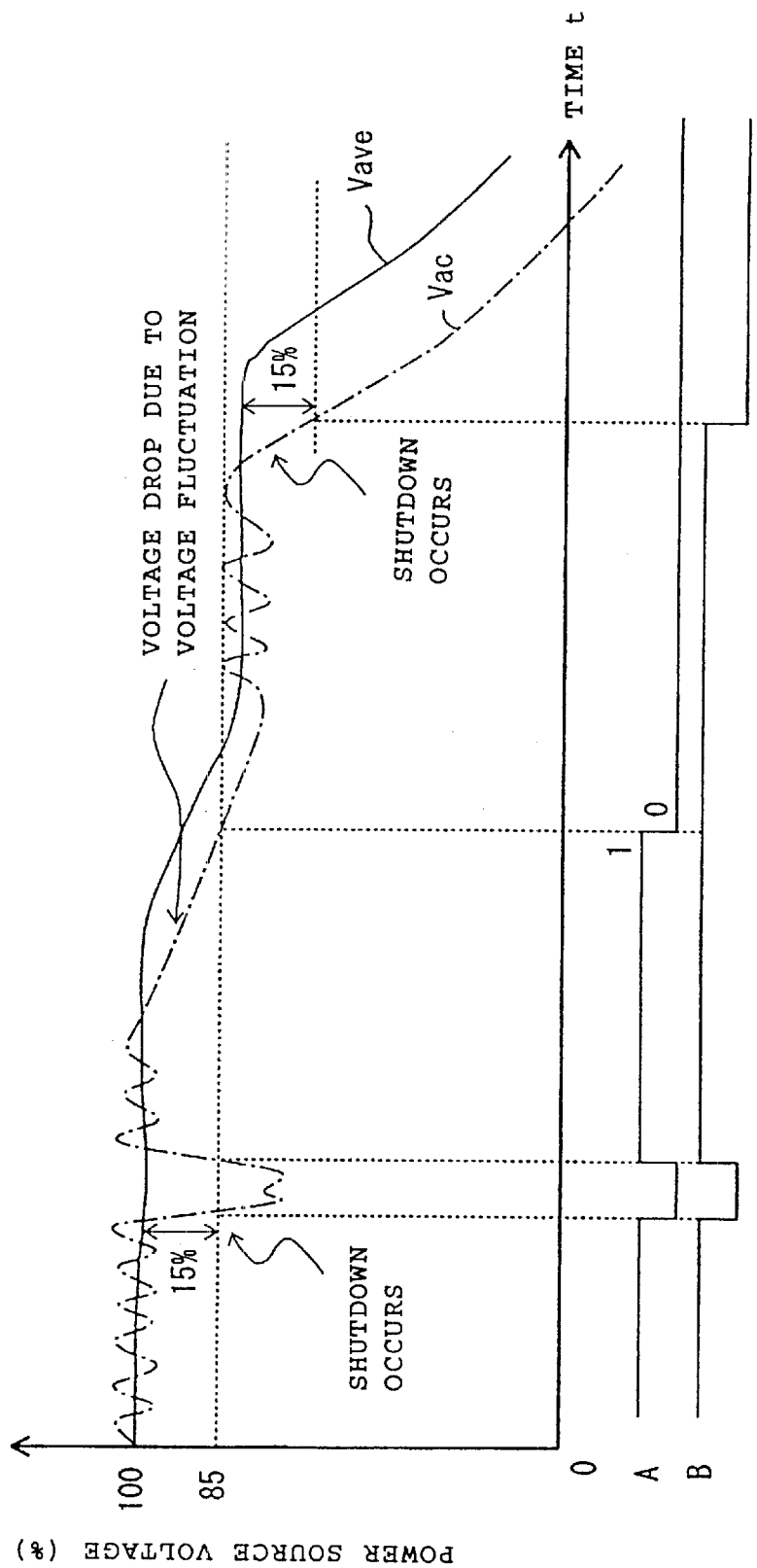
FIG. 2 is a timing chart given for purposes of comparing the power source voltage drop detection action of the prior art example with a first embodiment of the present invention.

The power source voltage drop detection signal PSF_S in this case is indicated by B in FIG. 1, but, as shown in this Figure, as the detection point in the case of this embodiment it is arranged for detection to occur at 85% of the average AC power source voltage signal Vave; thus, although occurrence of shutdown or drop of the AC power source voltage signal Vac, which is the instantaneous value of the system of AC power source 1, by more than 15% of the average AC power source voltage signal Vave is detected, there is no possibility of occurrence of spurious detection thereof as in the prior art example shown by A in FIG. 2, when the AC power source voltage signal Vac, which is the instantaneous value of AC power source 1, drops by more than 15% due to power source fluctuation.

(Second Embodiment)

Next, a power conversion device according to a second embodiment of the present invention is described with reference to FIG. 4. In this second embodiment, a short-period averaging circuit 10 is added to the construction of the first embodiment shown in FIG. 3.

Figure 4:
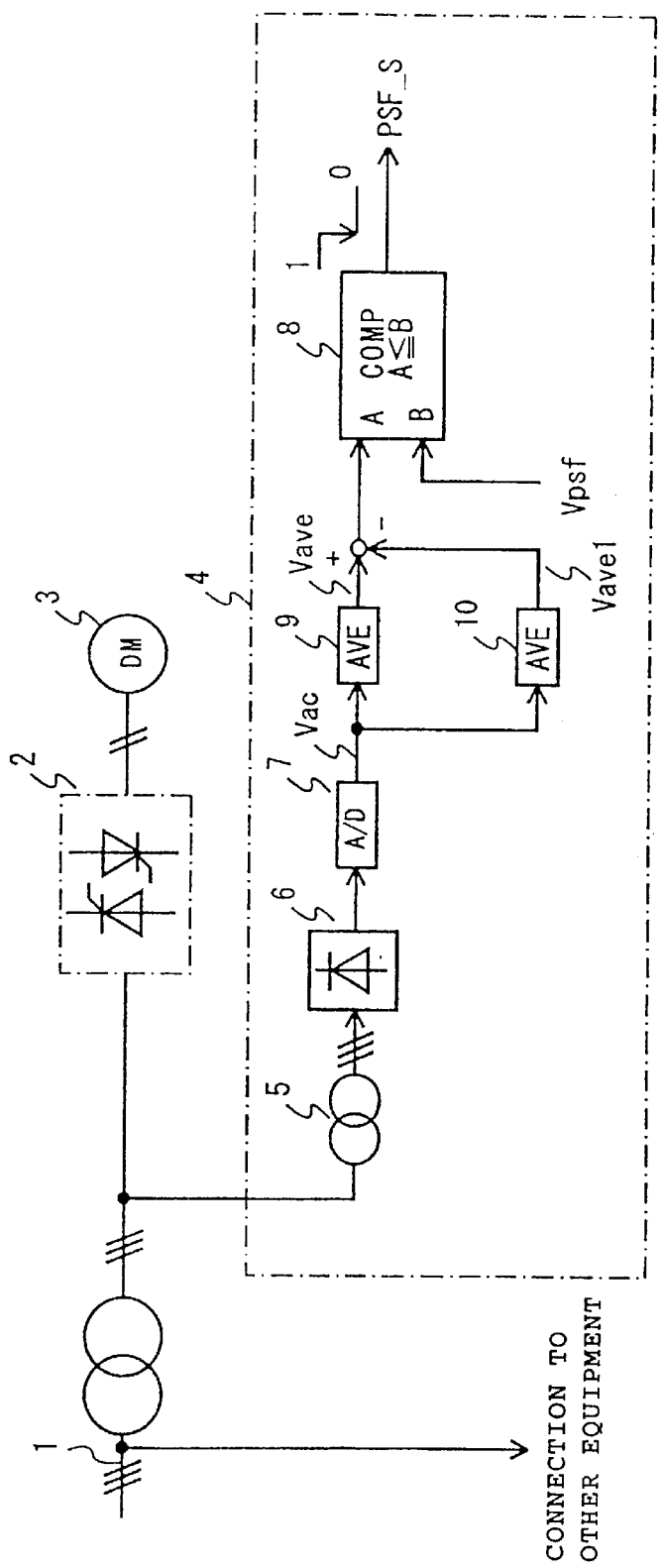
FIG. 4 is a block diagram illustrating the construction of a power conversion device according to a second embodiment of the present invention.

In FIG. 4, the AC power source voltage signal Vac of AC power source 1 detected by a power source voltage detection circuit comprising transformer 5, rectifier 6 and A/D converter 7 is input to averaging circuit 9 and the average AC power source voltage signal Vave is output from averaging circuit 9.

Power source voltage drop detection signal PSF_S is output by comparing this average AC power source voltage signal Vave and the short-period average AC power source voltage signal Vave 1 averaged by short-period averaging circuit 10 that averages the AC power source 1 in a time that is sufficiently shorter than that of averaging circuit 9, and inputting this deviation and the power source voltage detection signal Vpsf to comparator 8. By "a time that is sufficiently shorter" is meant that the ratio thereof with respect to that of the averaging circuit 9 is of the about order of 10:1.

That is, when the deviation of the average AC power source voltage signal Vave and the short-time average AC power source voltage signal Vave is more than a fixed value, power source voltage drop detection signal PSF_S is output (the output signal of comparator 8 changes from "1" to "0") and the voltage drop of the AC power source voltage can be detected.

With this embodiment, power source voltage drop detection operation can be performed with even less probability of spurious detection due to the influence of power source fluctuation than in the case of the first embodiment.

(Third Embodiment)

Figure 5:
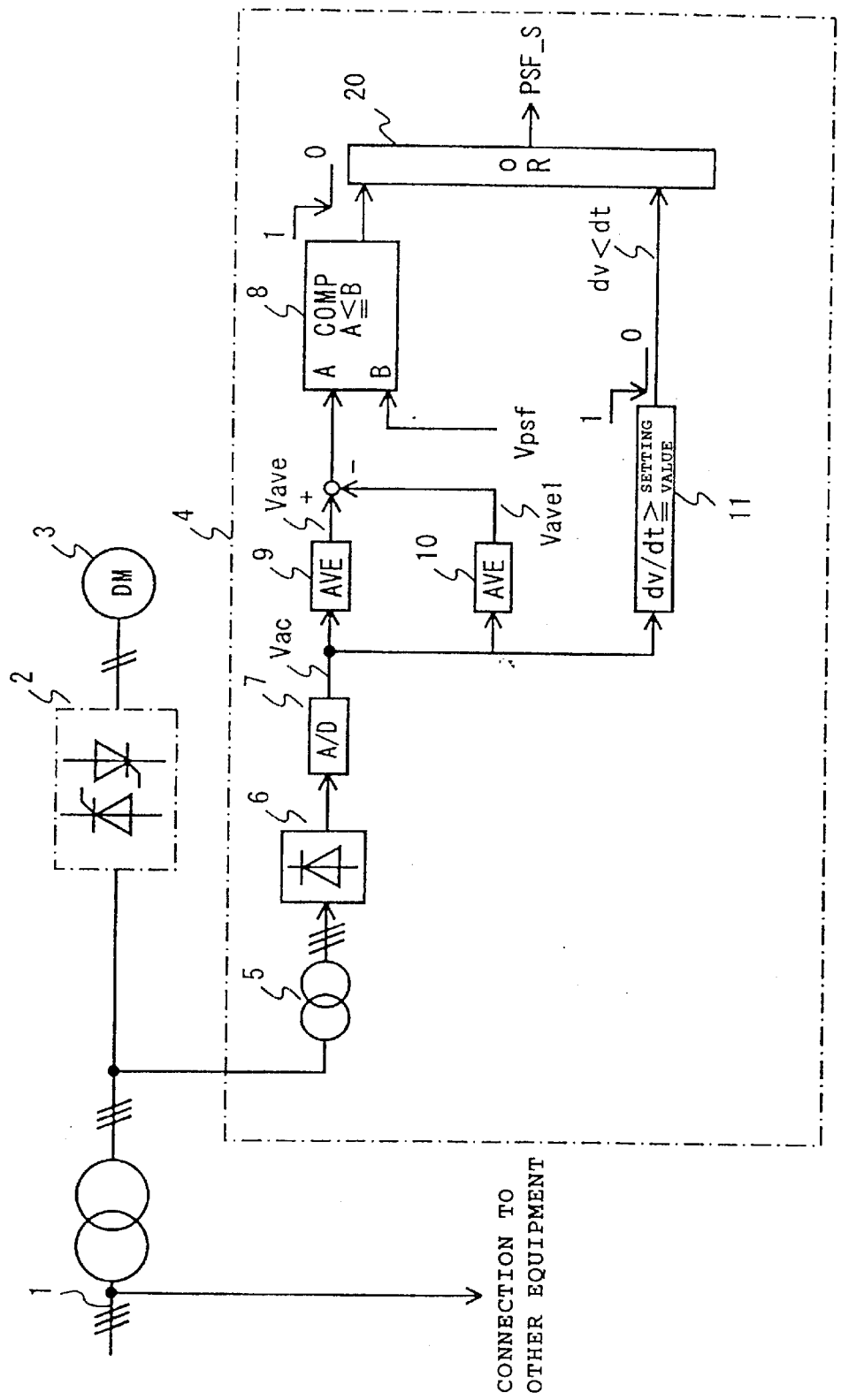
FIG. 5 is a block diagram illustrating the construction of a power conversion device according to a third embodiment of the present invention

A power conversion device according to a third embodiment of the present invention will next be described. In this third embodiment, a rate of voltage drop detector and an OR circuit (that is to say, a logical OR circuit) are added to the construction of the first or second embodiment, so that it is arranged to detect drop of the AC power source voltage with the addition of the condition that the drop of AC power source voltage is determined to be abrupt. FIG. 5 illustrates an example of the case of a construction in which a rate of voltage drop detector 11 and an OR circuit 20 (logical OR circuit 20) are added to the construction of the second embodiment illustrated in FIG. 4.

In FIG. 5, the AC power source voltage signal Vac, which is the instantaneous value of the AC power source 1 detected by a voltage detection circuit comprising transformer 5, rectifier 6 and A/D converter 7, is input to rate of voltage drop detector 11 and power source voltage rate of change signal dv/dt is output when the AC power source voltage signal Vac drops with a rate of drop of more than a set value.

This power source voltage rate of change signal dv/dt is added to the output condition of power source voltage drop detection signal PSF_S, so power source voltage drop detection is only performed when it is ascertained that the drop of the power source voltage is abrupt.

Specifically, the power source voltage drop detection signal PSF_S is output from OR circuit 20 (the output of OR circuit 20 is "0") only when the power source voltage drop detection signal PSF_S is being output from comparator 8 (output signal of comparator 8 becomes "0") and power source rate of voltage change signal dv/dt is being output (when output signal of rate of voltage drop detector 11 has become "0"), so power source voltage drop detection is only executed when it is ascertained that the drop of the power source voltage is abrupt.

Thus, by arranging that the power source voltage drop detection is only executed when is it is ascertained that the drop of power source voltage is abrupt, it is possible to prevent spurious detection of drop of power source voltage being caused by a gradual drop of voltage resulting from load fluctuation of the AC power source system.

It should be noted that this could be put into practice in the same way by adding a rate of voltage drop detector 11 and OR circuit 20 to the construction of the first embodiment shown in FIG. 3.

(Fourth Embodiment)

Figure 6:
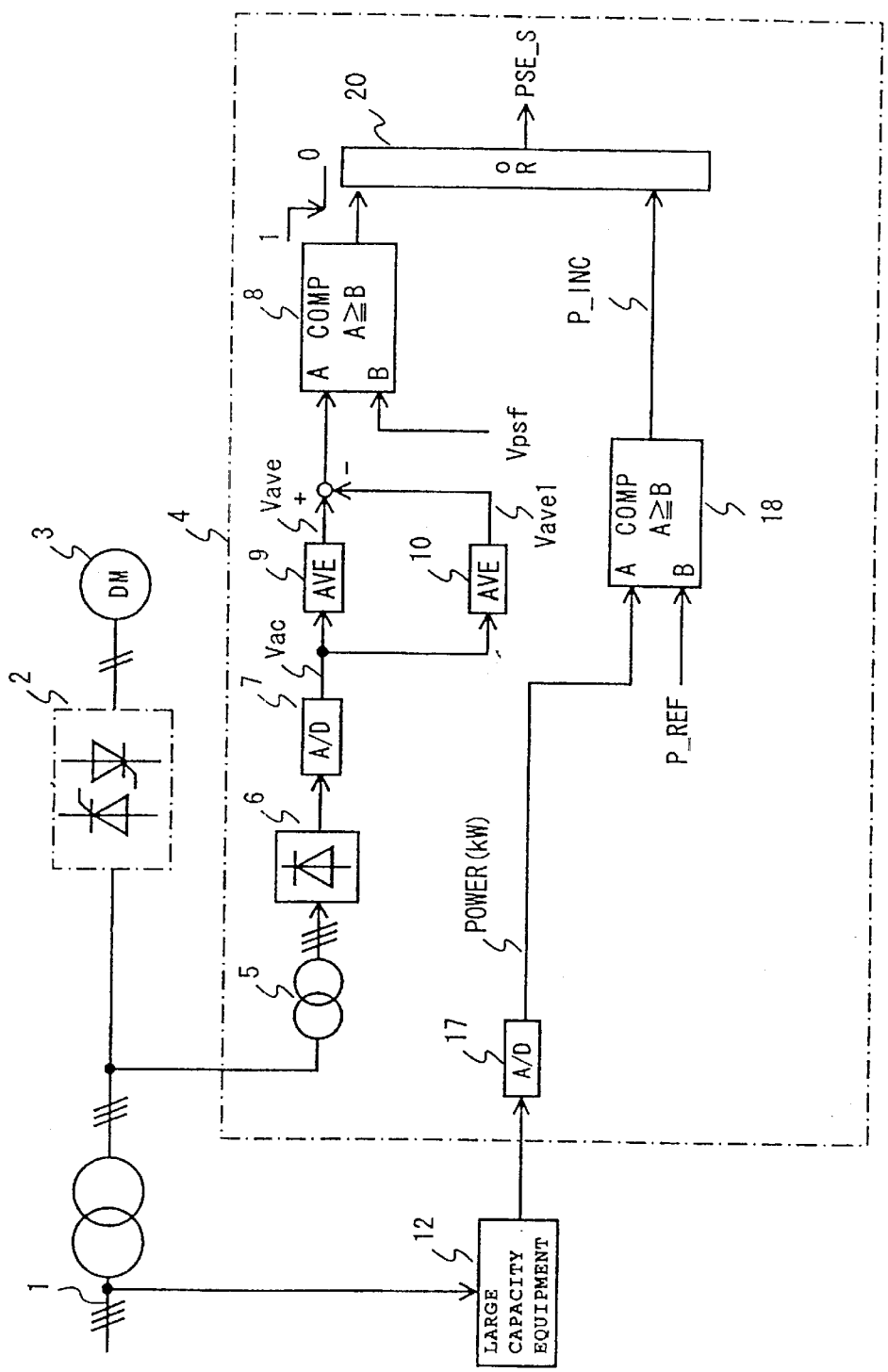
FIG. 6 is a block diagram illustrating the construction of a power conversion device according to a fourth embodiment of the present invention and FIG. 7 is a block diagram illustrating the construction of a detail of a power conversion device according to a fifth embodiment of the present invention.

Next, a power conversion device according to a fourth embodiment of the present invention is described. In this fourth embodiment, large capacity loads connected to the same AC power source system are monitored by adding an A/D converter, comparator and OR circuit to the construction of the first or second embodiment; thus the condition is added of restricting the detection of a drop of AC power source voltage to that occurring when there is an increase in large capacity loads. FIG. 6 illustrates an example wherein A/D converter 17, comparator 18 and OR circuit 20 are added to the construction of the second embodiment shown in FIG. 4.

In FIG. 6, system load increase signal P_INC is output by inputting to comparator 18 an amount of load signal POWER (kW) from large capacity load 12 connected with the same AC power source system as AC power source 1 and system load increase reference P_REF. By adding this system load increase signal P_INC to the output condition of power source voltage drop detection signal PSF_S, execution of power source voltage drop detection is restricted to the case where it is ascertained that the drop in power source voltage is due to increase in load of large capacity load 12 connected with the same AC power source system.

That is, the output signal of large capacity load 12 is supplied to comparator 18 through A/D converter 17 as load amount signal POWER (kW) and is compared with the system load increase reference P_REF. If the load amount signal POWER (kW) is more than the system load increase reference P_REF, the system load increase signal P_INC is output (output signal of comparator 18 becomes "1"). Execution of power source voltage drop detection is restricted so that, even if power source voltage drop detection signal PSF_S is output from comparator 18 (the output signal of comparator 18 is "0"), if the system load increase signal P_INC is output (output signal of comparator 18 is "1"), the power source voltage drop detection signal PSF_S is not output from OR circuit 20 (output signal of OR circuit 20 does not become "0").

In this way, by restricting power source voltage drop detection when it is ascertained that this is due to increase in load, above the prescribed amount, of large capacity load 12 connected to the same AC power source system, it is possible to prevent increase in load of large capacity load 12 from causing spurious detection of power source voltage drop produced by voltage drop of AC power source 1.

It should be noted that this could likewise be implemented by adding A/D converter 17, comparator 18 and OR circuit 20 to the construction of the first embodiment shown in FIG. 3.

(Fifth Embodiment)

Figure 7:
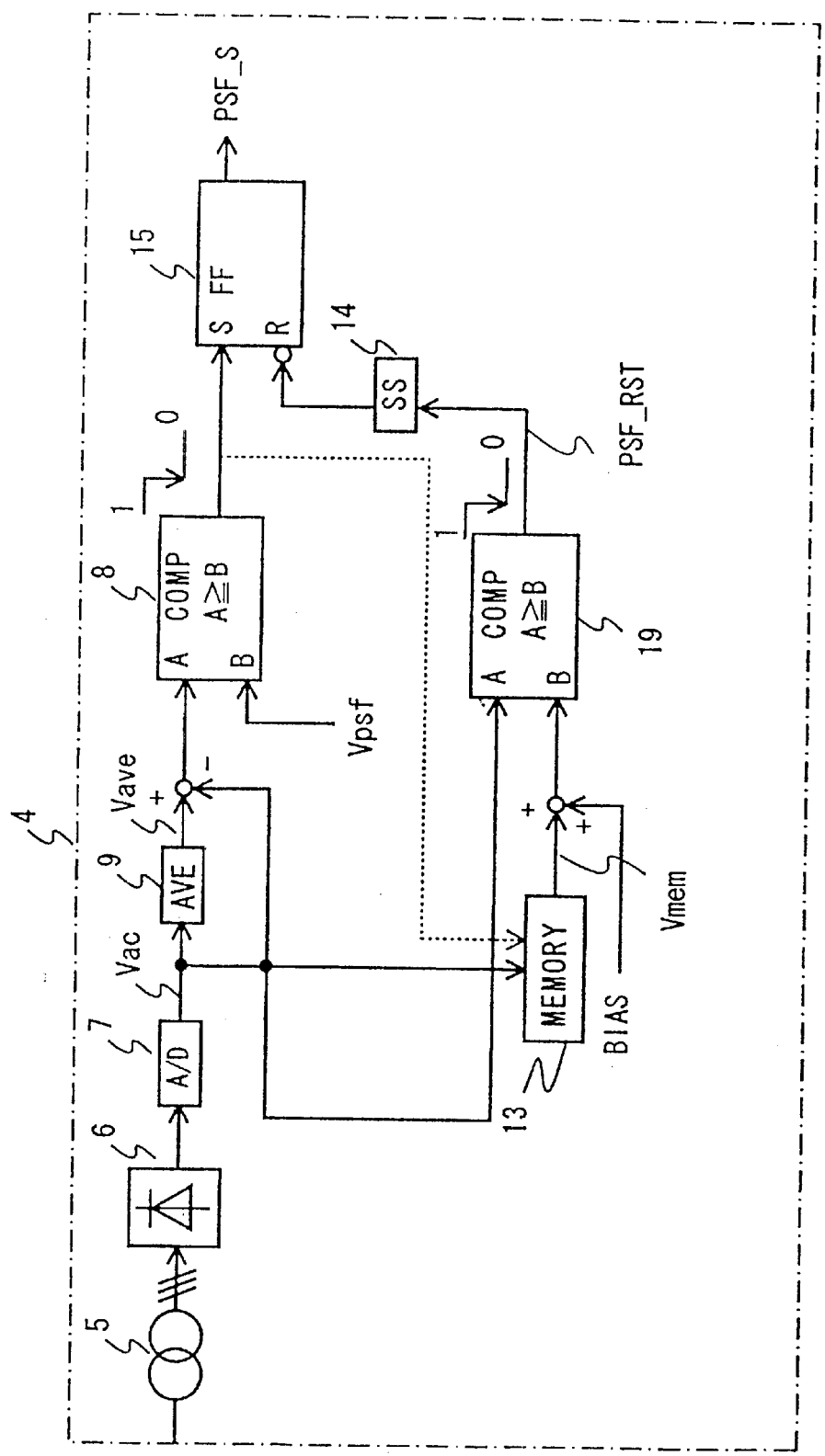

Next, a power conversion device according to a fifth embodiment of the present invention will be described. In this fifth embodiment, by adding a power source drop detection voltage memory, single-shot multivibrator, holding circuit and comparison circuit to the construction of the first or second embodiment, it is arranged that on detection of power source voltage drop, the instantaneous value of the AC power source voltage signal or averaged power source voltage signal obtained by averaging the AC power source voltage signal or the short-period averaged AC power source voltage signal obtained by averaging over a short period that is sufficiently short with respect to the average power source voltage are stored in memory and the held power source voltage drop detection is reset at the timepoint where the instantaneous value of the AC power source voltage signal or the signal averaged over a sufficiently short time with regard to the average power source voltage returns to the memory value or thereabove or to a value obtained by adding a bias value to the memory value or thereabove. FIG. 7 shows the construction of a portion of the power source voltage drop detection circuit 4 in an example in which power source drop detection voltage memory 13, single-shot multivibrator 14, holding circuit 15 and comparator 19 are added to the construction of the first embodiment shown in FIG. 3.

In FIG. 7, the power source voltage drop detection reset signal PSF_RST obtained by inputting to comparator 19 the AC power source voltage Vac, which is the instantaneous value of AC power source 1 and the voltage signal Vmem on detecting drop of power source voltage, obtained by storing in power source voltage drop detection voltage memory 13 the AC power source voltage signal Vac on power source voltage drop detection or the average power source voltage signal Vave obtained by averaging the AC power source voltage signal on detection of power source voltage drop (FIG. 7 shows the case where the AC power source voltage signal Vac is employed) is used as the means for resetting the power source voltage drop detection signal PSF_S, which is the output signal of holding circuit 15 that holds the output signal from comparator 8.

That is, the AC power source voltage signal Vac in the event of power source voltage drop (when the output signal of comparator 8 has become "0") is stored in memory circuit 13 as voltage Vmem on detection of power source voltage drop. Thus, AC power source voltage signal Vac, which is the instantaneous value of the AC power source 1 is input to comparator 19; comparator 19 compares this AC power source voltage signal Vac with the voltage signal Vmem on power source voltage drop detection or with a value obtained by adding a biasing quantity BIAS to the voltage signal Vmem on detection of power source voltage drop (FIG. 7 shows the case where comparison is made with the value obtained by adding the biasing quantity BIAS to the voltage signal Vmem on detection of power source voltage drop); and, when the AC power source voltage signal Vac becomes more than the voltage signal Vmem on detection of power source voltage drop or the value obtained by adding the biasing quantity BIAS to the voltage signal Vmem on detection of power source voltage drop, power source voltage drop detection reset signal PSF_RST is output (the output signal of comparator 19 becomes "0"). Power source voltage drop detection signal PSF_S held in holding circuit 15 is reset by applying this power source voltage drop detection reset signal PSF_RST to reset terminal R of holding circuit 15 as a pulse signal for resetting, through single-shot multivibrator 14.

In this way, when the AC power source voltage signal Vac, which is the instantaneous value of the AC power source 1, is reset to at or above a prescribed value from the low condition, the detection of power source voltage drop which was held can be reset.

It should be noted that this could be implemented in the same way by adding power source drop detection voltage memory 13, single-shot multivibrator 14, holding circuit 15 and comparator 19 to the construction of the second embodiment shown in FIG. 4.

As described above, with the present invention, even when the power source is affected by seasonal fluctuations or due to the operating condition of large capacity loads connected with the same system, power source voltage drop detection can be excellently achieved without being influenced thereby; a power conversion device can thus be provided wherein stable control can be maintained.

Further, specifically, according to the present invention, power source voltage drop detection operation can be achieved with little likelihood of spurious detection due to the influence of power source fluctuation.

Further according to the present invention spurious detection of power source voltage drop produced by gradual voltage drop resulting from for example load fluctuation of the power source system can be prevented by performing power source voltage drop detection operation only when it is ascertained that the drop of power source voltage is abrupt.

Yet further according to the present invention spurious detection of power source voltage drop produced by voltage drop generated by increase of load of large capacity loads connected to the same power source system can be prevented.

Yet further according to the present invention the held power source voltage drop detection can be reset when the power source voltage is reset to at or above a prescribed value from a dropped condition.

Obviously, numerous additional modifications and variations of the present invention are possible in light of the above teachings. It is therefore to be understood that within the scope of the appended claims, the present invention may be practiced otherwise than as specially described herein.

What is claimed is:

1. Power conversion device that converts power from a power source to any desired voltage, comprising:

averaging unit that obtains an average power source voltage signal by averaging said power source voltage signal; and power source voltage drop detection unit that compares said average power source voltage signal obtained by said averaging unit and an instantaneous value of said power source voltage signal and outputs a power source voltage drop detection signal on detection of drop of a power source voltage by a deviation becoming more than a prescribed value.

2. Power conversion device that converts power from a power source to any desired voltage, comprising:

averaging unit that obtains an average power source voltage signal by averaging said power source voltage signal;

short period averaging unit that obtains a short-period average power source voltage signal by averaging said power source voltage signal over a time which is short in relation to said average power source voltage signal obtained by said averaging unit;

power source voltage drop detection unit that compares said average power source voltage signal obtained by said averaging unit and said short period average power source voltage signal obtained by said short period averaging unit and outputs a power source voltage drop detection signal on detection of drop of a power source voltage by a deviation becoming more than a prescribed value.

3. Power conversion device according to claim 1, wherein said power source voltage drop detection unit comprises rate of voltage drop detection unit that detects a rate of power source voltage drop and, when drop of a power source voltage is detected by said deviation becoming more than a certain prescribed value, outputs said power source voltage drop detection signal only when said rate of drop detected by said rate of voltage drop detection unit is more than a set value.

4. Power conversion device according to claim 1, wherein said power source voltage drop detection unit comprises load increase detection unit that detects increase of load of large capacity loads connected to a same power source system and, even when drop of said power source voltage is detected by said deviation becoming more than a certain prescribed value, if increase of said load of more than a prescribed amount is detected by said load increase detection unit, restricts output of said power source voltage drop detection signal.

5. Power conversion device according to claim 1, wherein said power source voltage drop detection unit comprises:

holding unit that holds detection of drop of power source voltage by said deviation becoming more than a prescribed value;

memory unit that stores an instantaneous value of said power source voltage signal or said average power source voltage signal or said short-period average power source voltage signal when drop of said power source voltage is detected by said deviation becoming more than a prescribed value; and resetting unit that resets holding of said power source voltage drop detection by said holding unit when said instantaneous value of said power source voltage signal or said power source voltage signal averaged over a short period is reset to at or above a value stored by said memory unit or at or above a value obtained by a biasing quantity to a stored value.

6. Power conversion device according to claim 2, wherein said power source voltage drop detection unit comprises rate of voltage drop detection unit that detects a rate of power source voltage drop and, when drop of a power source voltage is detected by said deviation becoming more than a certain prescribed value, outputs said power source voltage drop detection signal only when said rate of drop detected by said rate of voltage drop detection unit is more than a set value.

7. Power conversion device according to claim 2, wherein said power source voltage drop detection unit comprises load increase detection unit that detects increase of load of large capacity loads connected to a same power source system and, even when drop of said power source voltage is detected by said deviation becoming more than a certain prescribed value, if increase of said load of more than a prescribed amount is detected by said load increase detection unit, restricts output of said power source voltage drop detection signal.

8. Power conversion device according to claim 2, wherein said power source voltage drop detection unit comprises:

holding unit that holds detection of drop of power source voltage by said deviation becoming more than a prescribed value;

memory unit that stores an instantaneous value of said power source voltage signal or said average power source voltage signal or said short-period average power source voltage signal when drop of said power source voltage is detected by said deviation becoming more than a prescribed value; and resetting unit that resets holding of said power source voltage drop detection by said holding unit when said instantaneous value of said power source voltage signal or said power source voltage signal averaged over a short period is reset to at or above a value stored by said memory unit or at or above a value obtained by adding a biasing quantity to a stored value.

* * * * *